United States Patent
Chang et al.

(10) Patent No.: US 10,847,440 B2
(45) Date of Patent: Nov. 24, 2020

(54) SELF-CIRCULATING COOLING SYSTEM

(71) Applicant: HONGFUJIN PRECISION ELECTRONICS(TIANJIN)CO.,LTD., Tianjin (CN)

(72) Inventors: Chih-Hung Chang, New Taipei (TW); Chao-Ke Wei, New Taipei (TW); Tze-Chern Mao, New Taipei (TW); Yen-Chun Fu, New Taipei (TW)

(73) Assignee: HONGFUJIN PRECISION ELECTRONICS(TIANJIN)CO.,LTD., Tianjin (CN)

( * ) Notice: Subject to any disclaimer, the term of this patent is extended or adjusted under 35 U.S.C. 154(b) by 0 days.

(21) Appl. No.: 16/542,542

(22) Filed: Aug. 16, 2019

(65) Prior Publication Data
US 2020/0343159 A1    Oct. 29, 2020

(30) Foreign Application Priority Data

Apr. 23, 2019    (CN) .......................... 2019 1 0330362

(51) Int. Cl.
| | | |
|---|---|---|
| *H01L 23/34* | (2006.01) | |
| *H01L 23/473* | (2006.01) | |
| *H01L 23/44* | (2006.01) | |
| *H05K 7/20* | (2006.01) | |

(52) U.S. Cl.
CPC ............ *H01L 23/44* (2013.01); *H01L 23/473* (2013.01); *H05K 7/203* (2013.01)

(58) Field of Classification Search
CPC ............... H05K 7/20236; H05K 7/203; H05K 7/20318; H05K 7/20809; H05K 7/20781; H05K 7/20818; H05K 7/20281; H05K 7/20; H05K 7/20381; H05K 7/20881; G06F 1/20; G06F 2200/201; G06F 1/206; H01L 23/473; H01L 23/44; F28D 15/025; F28D 2021/0028
USPC ............... 361/699, 679.31, 700; 165/104.33, 165/104.19, 104.21
See application file for complete search history.

(56) References Cited

U.S. PATENT DOCUMENTS

| | | | | |
|---|---|---|---|---|
| 4,572,286 A | * | 2/1986 | Fujii | ..................... F25B 23/006 165/104.19 |
| 2010/0254087 A1 | * | 10/2010 | Godfroy | ............ H05K 7/20909 361/699 |

* cited by examiner

*Primary Examiner* — Mandeep S Buttar
(74) *Attorney, Agent, or Firm* — ScienBiziP, P.C.

(57) ABSTRACT

A system for cooling an electronic device includes a pressure tank in a sealed cavity, the cavity being filled with an insulating liquid. The electronic device is also housed in the cavity and is immersed in the insulating liquid. The pressure tank is immersed in water. The liquid when heated becomes less dense and flows to exchange and lose heat to the cold water via the pressure tank. After cooling by the pressure tank, the now-denser liquid flows back to the other side of the electronic device because of density differences.

14 Claims, 5 Drawing Sheets

SELF-CIRCULATING COOLING SYSTEM

FIELD

The subject matter herein generally relates to computer cooling.

BACKGROUND

A server can be immersed in liquid in a container for cooling. However, this method needs an additional cooling apparatus outside the container to cool the liquid and to keep the liquid circulating. The additional cooling apparatus may increase cost and occupies more space, and cannot cool a server with high power consumption density.

Therefore, there is room for improvement within the art.

BRIEF DESCRIPTION OF THE DRAWINGS

Implementations of the present technology will now be described, by way of embodiments, with reference to the attached figures.

DETAILED DESCRIPTION

Figure 1:
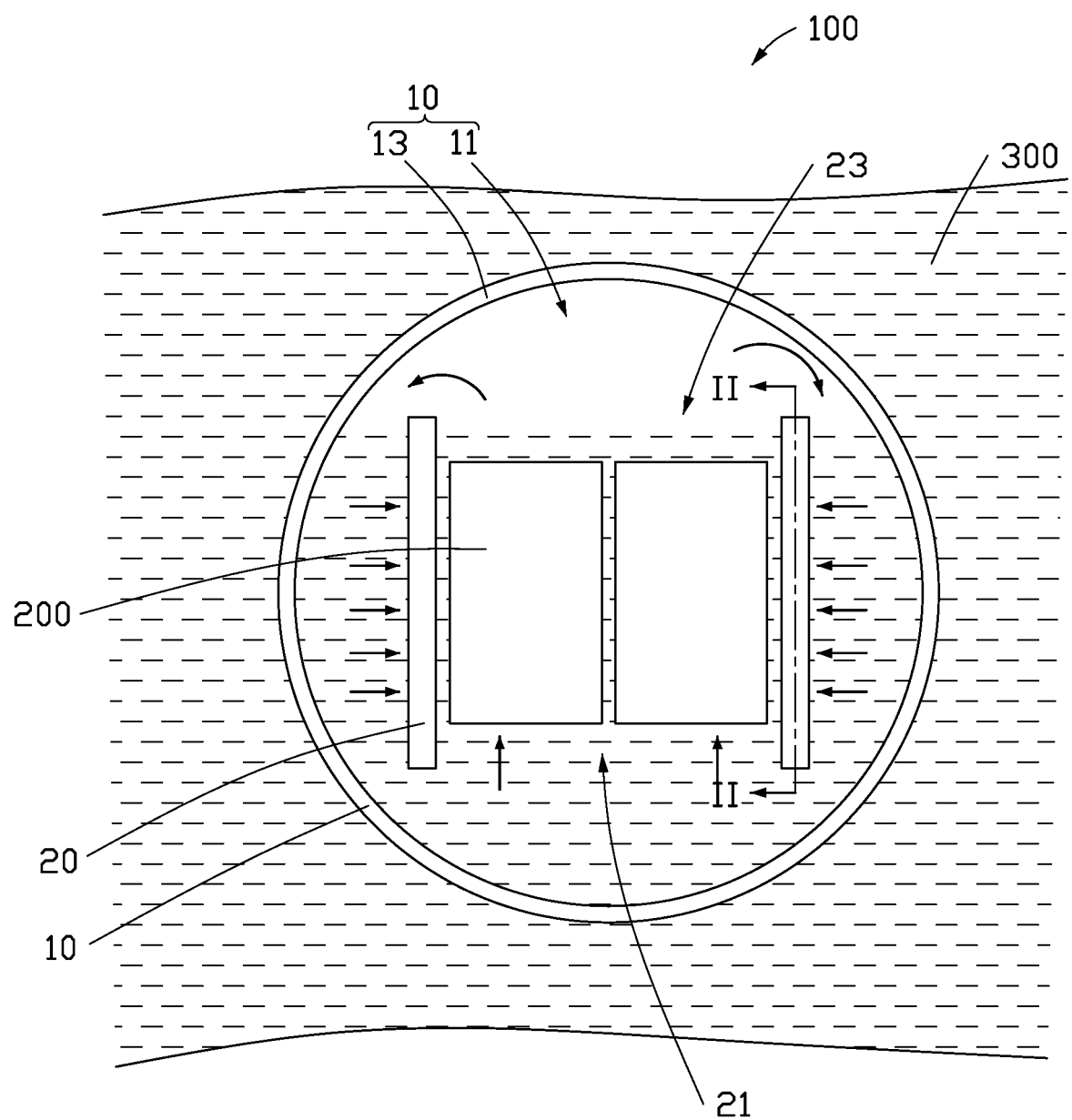
FIG. 1 is a schematic, plan view of a cooling system and an electronic device according to a first embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

Referring to FIG. 1, a cooling system 100 of a first embodiment is used for cooling a liquid-cooled electronic device 200. The cooling system 100 includes a pressure tank 10 and a supporting part 20. The pressure tank 10 defines a sealed cavity 11. The supporting part 20 is set in the cavity 11. The supporting part 20 is used for structurally supporting the electronic device 200. The pressure tank 10 is filled with insulating liquid 30. In the first embodiment, the cavity 11 is not fully filled by the insulating liquid 30. The electronic device 200 is completely immersed in the insulating liquid 30. In the first embodiment, the pressure tank 10 is immersed in water environment 300. Heat is exchanged between the insulating liquid 30 and the water environment 300 via the tank 10. Due to the mass of water, the pressure tank 10 and the insulating liquid 30 can be cooled down quickly. The insulating liquid 30 has different densities when hot and when cool, this property causes self-circulation of the insulating liquid 30 flows around the electronic device 200.

The two sides of the supporting part 20, which are towards and away from the surface of the water environment 300, respectively define a first hole 21 and a second hole 23. The second hole 23 is near the surface of the water environment 300. The insulating liquid 30 flows into the supporting part 20 through the first hole 21. A temperature of the insulating liquid 30 rises when acting to cool the electronic device 200, and a phase state of the insulating liquid 30 changes from a single-phase state to a two-phase state. Density of the insulating liquid 30 is decreased in the two-phase state. The insulating liquid 30 flows upwards to flow out from the second hole 23, and continues rising to the top of the pressure tank 10. The pressure tank 10 is always being cooled by the water environment 300, thus the insulating liquid 30 flowing out from the second hole 23 will be cooled down quickly, and a phase state of the insulating liquid 30 again changes, from the two-phase state to the single-phase state. Density of the insulating liquid 30 is increased, and the insulating liquid 30 flows back to the side of the supporting part 20 which is away from the surface of the water environment 300. Referring to FIG. 1, arrows show the flow direction of the insulating liquid 30. In this way, the electronic device 200 is being constantly cooled.

In the first embodiment, along a direction from the pressure tank 10 to the water environment 300, the distance between the electronic device to one side of the pressure tank which is near the surface of the water environment is closer than a distance between the electronic device to the other side of the pressure tank. Thus, the insulating liquid 30 near the first hole 21 is more in quantity than the insulating liquid 30 near the second hole 23, so the insulating liquid 30 flowing into the first hole 21 will be cold enough.

The shell of the pressure tank 10 is waterproof, stress-resistant, and heat-conductive. The pressure tank 10 isolates the electronic device 200 from the water environment 300.

Figure 2:
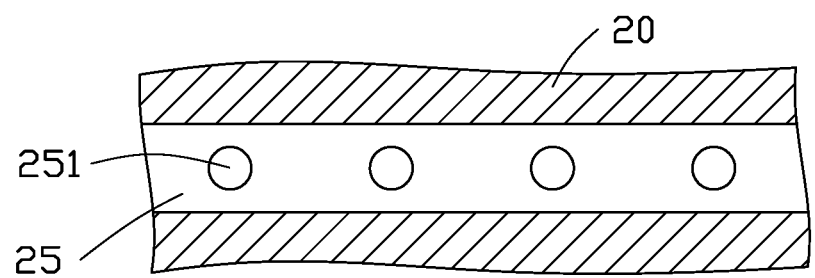
FIG. 2 is a cross-sectional view taken along line II-II of FIG. 1.

Referring to FIG. 2, the supporting part 20 defines a tube 25. A side of the supporting part 20 towards the electronic device 200 defines a plurality of nozzles 251. The nozzles 251 are connected to the tube 25. The insulating liquid 30 flows into the tube 25 through the nozzles 251. The nozzles 251 are aligned with liquid ports defined on the electronic device 200. The nozzles 251 guide insulating liquid 30 which is cold near the second hole 23 into the electronic device 200, which improves the cooling efficiency.

In the first embodiment, the electronic device 200 is a server with high power consumption. In another embodiment, the electronic device 200 can be a normal server or a server module.

In another embodiment, the electronic device 200 can be only partly immersed in the insulating liquid 30.

The water environment 300 can be natural such as a sea, river, or lake.

The insulating liquid 30 can be mineral oils or liquid carbon dioxide.

The pressure tank 10 is substantially cylindrical.

Figure 3:
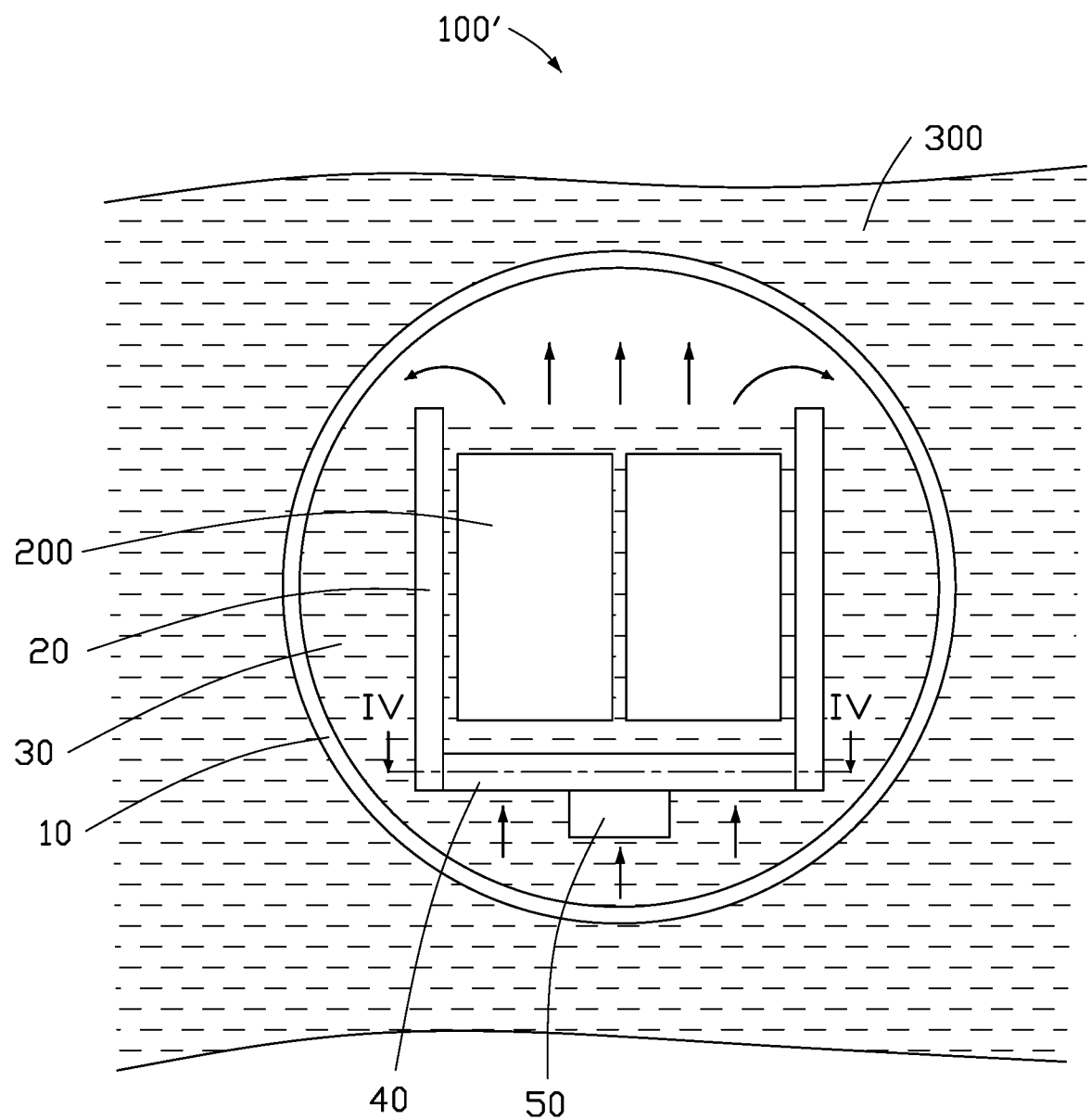
FIG. 3 is a schematic, plan view of a cooling system and an electronic device according to a second embodiment.
Figure 4:
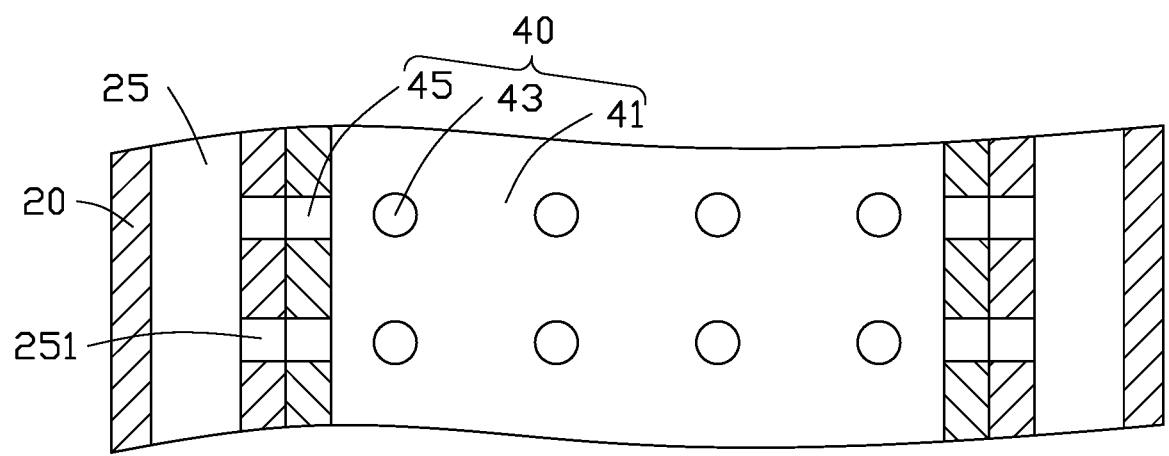
FIG. 4 is a cross-sectional view taken along line IV-IV of FIG. 3.

Referring to FIGS. 3 and 4, a second embodiment of a cooling system (cooling system 100') is similar to the cooling system 100 of the first embodiment. The differences between the cooling system 100' and the cooling system 100 are that the cooling system 100' further includes a guiding part 40 and a driving pump 50. The guiding part 40 and the driving pump 50 are set in the cavity 11. The guiding part 40 seals the first hole 21. The driving pump 50 is located at side of the guiding part 40 which is away from the electronic device 200. The guiding part 40 defines a guiding path 41 which is connected with the driving pump 50. The guiding part 40 defines a plurality of guiding ports 43 towards the electronic device 200. The guiding ports 43 are aligned with the liquid ports defined on the electronic device 200. The driving pump 50 drives the insulating liquid 30 at a side of the guiding part 40 which is away from the electronic device 200 to the electronic device 200. The insulating liquid 30 flows through and out of the guiding path 41 and ports 43 into the electronic device 200 to cool it.

The driving pump 50 hastens the flow rate of the insulating liquid 30 in the pressure tank 10. In this way, the cold insulating liquid 30 flows fast into the electronic device 200, and the heated insulating liquid 30 flows out of the electronic device 200 quickly back to a side of the supporting part 20 which is away from the surface of the water environment 300. Thus, the hot insulating liquid 30 cools down quickly, and the efficiency of heat exchange is improved.

Referring to FIG. 4, the guiding part 40 defines a plurality of connecting ports 45, the ports 45 dock with the nozzles 251.

In another embodiment, the guiding part 40 is omitted. The driving pump 50 drives the insulating liquid 30 which is away from the surface of the water environment 300 to flow to the electronic device 200.

Figure 5:
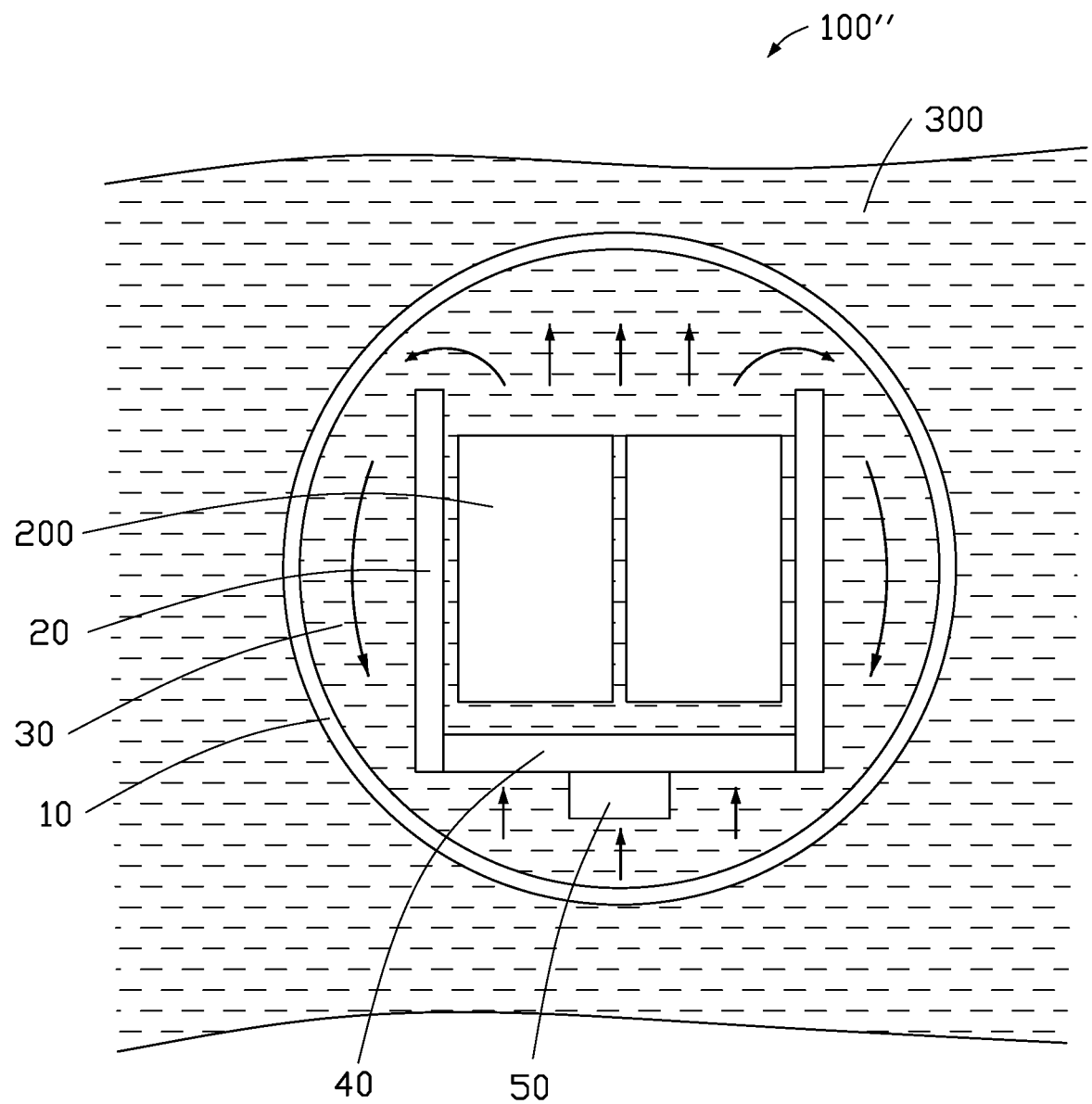
FIG. 5 is a schematic, plan view of a cooling system and an electronic device according to a third embodiment.

Referring to FIG. 5, a third embodiment of a cooling system (cooling system 100") is similar to the cooling system 100' of the second embodiment. The differences between the cooling system 100" and the cooling system 100' are that in the third embodiment, the cavity 11 is fully filled with the insulating liquid 30. The pressure tank 10 is immersed in the water environment 300. The driving pump 50 drives the insulating liquid 30 which is away from the surface of the water environment 300 to flow to the electronic device 200. The insulating liquid 30 flows through and out of the guiding path 41 and ports 43 into the electronic device 200 to cool it.

In another embodiment, the guiding part 40 and the driving pump 50 are omitted. After flowing into the electronic device 200, the insulating liquid 30 is turned into the two-phase state. The heated insulating liquid 30 flows out from one side of the electronic device 200 and is cooled by the pressure tank 10, then flowing back to the other side of the electronic device 200 because of differences in density.

The pressure tank 10 contains the electronic device 200. The pressure tank 10 is immersed in water environment 300. The insulating liquid 30 exchanges heat efficiently via the pressure tank 10. Around the electronic device 200, the insulating liquid 30 is heated. The heated insulating liquid 30 flows out from one side of the electronic device 200 and is cooled by the pressure tank 10 and flows back to the other side of the electronic device 200. Thus, the insulating liquid 30 flows in and out constantly around the electronic device 200 and keeps the electronic device 200 cooled at a high efficiency.

The embodiments shown and described above are only examples. Many such details are found in the relevant art. Therefore, such details are neither shown nor described. Even though numerous characteristics and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A cooling system comprising: a pressure tank defining a sealed cavity, wherein the pressure tank is adapted for immersing in water when the cavity is fully filled with insulating liquid, when in use, the 5 cavity is configured for housing an electronic device and immersing the electronic device in the insulating liquid, the insulating liquid exchanges heat with the water environment via the pressure tank; driving by density differences between heated insulating liquid and cooled insulating liquid, the insulating liquid flows in and out of the electronic device recurrently; and further comprising a supporting part, wherein the supporting part is positioned in the cavity and is configured for immobilizing the electronic device, the supporting part defines a first hole and a second hole, the first hole is configured for being located above the electronic device, and the second hole is configured for being located below the electronic device, and wherein the supporting part defines a tube and a plurality of nozzles, wherein the plurality of nozzles are in fluid communication with the tube.

2. The cooling system of claim 1, further comprising a driving pump set in the cavity and is located away from the surface of the water environment, the driving pump drives the insulating liquid flows to the electronic device.

3. The cooling system of claim 2, further comprising a guiding part set in the cavity, the guiding part seals one of the plurality of nozzles which is away from the surface of the water environment, the driving pump is located at one side of the guiding part which is away from the electronic device, the guiding part defines a guiding path which is connected to the driving pump, the guiding part defines a plurality of guiding ports towards the electronic device and connected 5 to the guiding path.

4. The cooling system of claim 3, wherein the guiding part defines a plurality of connecting ports which are used for docking with the plurality of nozzles.

5. The cooling system of claim 1, wherein the insulating liquid fully immerses the electronic device.

6. The cooling system of claim 1, wherein the shell of the pressure tank is waterproof, stress-resistant, and heat-conductive.

7. The cooling system of claim 1, wherein a distance between the electronic device to one side of the pressure tank which is near the surface of the water environment is closer than a distance between the electronic device to the other side of the pressure tank.

8. A cooling system comprising: a pressure tank defining a sealed cavity, wherein the cavity is partly filled with insulating liquid, the pressure tank is immersed in a water environment, when in use, the cavity is used for housing an electronic device and the insulating liquid immerses the electronic device, the insulating liquid exchanges heat with the water environment via the pressure tank; driving by density difference between heated insulating liquid and cooled insulating liquid, the insulating liquid flows in and out of the electronic device recurrently; and further comprising a supporting part, wherein the supporting part is set in the cavity and is used for immobilizing the electronic device, the supporting part defines a first hole and a second hole, the first hole is configured for being located above the electronic device, and the second hole is configured for being located below the electronic device, and wherein the supporting part defines a tube and a plurality of nozzles, wherein the plurality of nozzles are in fluid communication with the tube.

9. The cooling system of claim 8, further comprising a driving pump set in the cavity and is located away from the surface of the water environment, the driving pump drives the insulating liquid flows to the electronic device.

10. The cooling system of claim 9, further comprising a guiding part set in the cavity, the guiding part seals one of the plurality of nozzles which is away from the surface of the water environment, the driving pump is located at one side of the guiding part which is away from the electronic device, the guiding part defines a guiding path which is connected to the driving pump, the guiding part defines a plurality of guiding ports towards the electronic device and connected to the guiding path.

11. The cooling system of claim 10, wherein the guiding part defines a plurality of connecting ports which are used for docking with the plurality of nozzles.

12. The cooling system of claim 8, wherein the insulating liquid fully immerses the electronic device.

13. The cooling system of claim 8, wherein the shell of the pressure tank is waterproof, stress-resistant, and heat-conductive.

14. The cooling system of claim 8, wherein a distance between the electronic device to one side of the pressure tank which is near the surface of the water environment is closer than a distance between the electronic device to the other side of the pressure tank.

* * * * *